(12) United States Patent
Hirasawa et al.

(10) Patent No.: US 9,748,090 B2
(45) Date of Patent: Aug. 29, 2017

(54) SEMICONDUCTOR MANUFACTURING APPARATUS AND MANUFACTURING METHOD OF SEMICONDUCTOR DEVICE

(71) Applicant: Toshiba Memory Corporation, Minato-ku (JP)

(72) Inventors: Shinichi Hirasawa, Mie (JP); Dai Fukushima, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 154 days.

(21) Appl. No.: 14/740,414

(22) Filed: Jun. 16, 2015

(65) Prior Publication Data

US 2016/0218001 A1    Jul. 28, 2016

Related U.S. Application Data

(60) Provisional application No. 62/106,268, filed on Jan. 22, 2015.

(51) Int. Cl.
| | |
|---|---|
| *B24B 37/22* | (2012.01) |
| *H01L 21/02* | (2006.01) |
| *H01L 21/306* | (2006.01) |
| *B24B 37/24* | (2012.01) |
| *H01L 21/67* | (2006.01) |

(52) U.S. Cl.
CPC ........ *H01L 21/02057* (2013.01); *B24B 37/24* (2013.01); *H01L 21/30625* (2013.01); *H01L 21/67046* (2013.01)

(58) Field of Classification Search
CPC .. B24B 37/24; B08B 1/00; B08B 1/04; H01L 21/67046

USPC ......... 451/44, 57, 67; 15/77, 88.1–88.3, 102
See application file for complete search history.

(56) References Cited

U.S. PATENT DOCUMENTS

| | | | | |
|---|---|---|---|---|
| 5,901,399 | A * | 5/1999 | Moinpour | A62C 13/003 15/102 |
| 6,079,073 | A * | 6/2000 | Maekawa | B08B 1/007 15/102 |
| 6,167,583 | B1 * | 1/2001 | Miyashita | B08B 1/04 134/172 |
| 6,186,873 | B1 * | 2/2001 | Becker | B08B 1/00 15/177 |
| 6,257,966 | B1 | 7/2001 | Ishikawa et al. | |
| 6,733,596 | B1 * | 5/2004 | Mikhaylichenko | B08B 1/04 134/6 |

(Continued)

FOREIGN PATENT DOCUMENTS

| | | |
|---|---|---|
| JP | 6-17283 | 5/1994 |
| JP | 2000-021828 | 1/2000 |

(Continued)

*Primary Examiner* — George Nguyen
(74) *Attorney, Agent, or Firm* — Oblon, McClelland, Maier & Neustadt, L.L.P.

(57) ABSTRACT

A semiconductor manufacturing apparatus according to an embodiment includes a first cleaner and a second cleaner. The first cleaner polishes a semiconductor substrate or a polishing target material on the semiconductor substrate with an abrasive and then cleans a top face of the semiconductor substrate or of the polishing target material while the semiconductor substrate is rotated. The second cleaner rubs an end portion of the semiconductor substrate with a physical contact according to rotation of the semiconductor substrate.

17 Claims, 4 Drawing Sheets

(56) References Cited

U.S. PATENT DOCUMENTS

| | | | | |
|---|---|---|---|---|
| 6,837,777 | B2* | 1/2005 | Ziemins | B08B 1/04 15/77 |
| 8,127,395 | B2* | 3/2012 | Yoon | H01L 21/67046 134/6 |
| 2001/0051500 | A1* | 12/2001 | Homma | B24B 37/30 451/286 |
| 2002/0023715 | A1* | 2/2002 | Kimura | B24B 37/042 156/345.12 |
| 2002/0031914 | A1* | 3/2002 | Svirchevski | H01L 21/67046 438/712 |
| 2002/0062842 | A1* | 5/2002 | Mikhaylich | H01L 21/67046 134/6 |
| 2005/0155629 | A1* | 7/2005 | Ravkin | H01L 21/67028 134/6 |
| 2005/0229950 | A1* | 10/2005 | Chou | B08B 1/00 134/18 |
| 2005/0245171 | A1* | 11/2005 | Hosaka | B24D 18/0009 451/6 |
| 2005/0260942 | A1* | 11/2005 | Kawahara | B24B 37/26 451/527 |
| 2006/0270231 | A1* | 11/2006 | Tran | H01L 21/02087 438/690 |
| 2007/0059935 | A1* | 3/2007 | Kozasa | B24B 37/044 438/690 |
| 2007/0149096 | A1* | 6/2007 | Nishimura | B24B 37/30 451/41 |
| 2008/0171493 | A1* | 7/2008 | Feng | B24B 37/20 451/59 |
| 2009/0036033 | A1* | 2/2009 | Wasinger | B24B 1/04 451/44 |
| 2011/0177305 | A1* | 7/2011 | Feng | B24B 37/24 428/196 |
| 2011/0248788 | A1* | 10/2011 | Fujihira | B24B 37/08 331/158 |
| 2013/0012107 | A1* | 1/2013 | Kazuno | B24B 37/26 451/41 |
| 2013/0048018 | A1 | 2/2013 | Wargo et al. | |

FOREIGN PATENT DOCUMENTS

| | | |
|---|---|---|
| JP | 2001-212528 | 8/2001 |
| JP | 2013-520803 | 6/2013 |

* cited by examiner

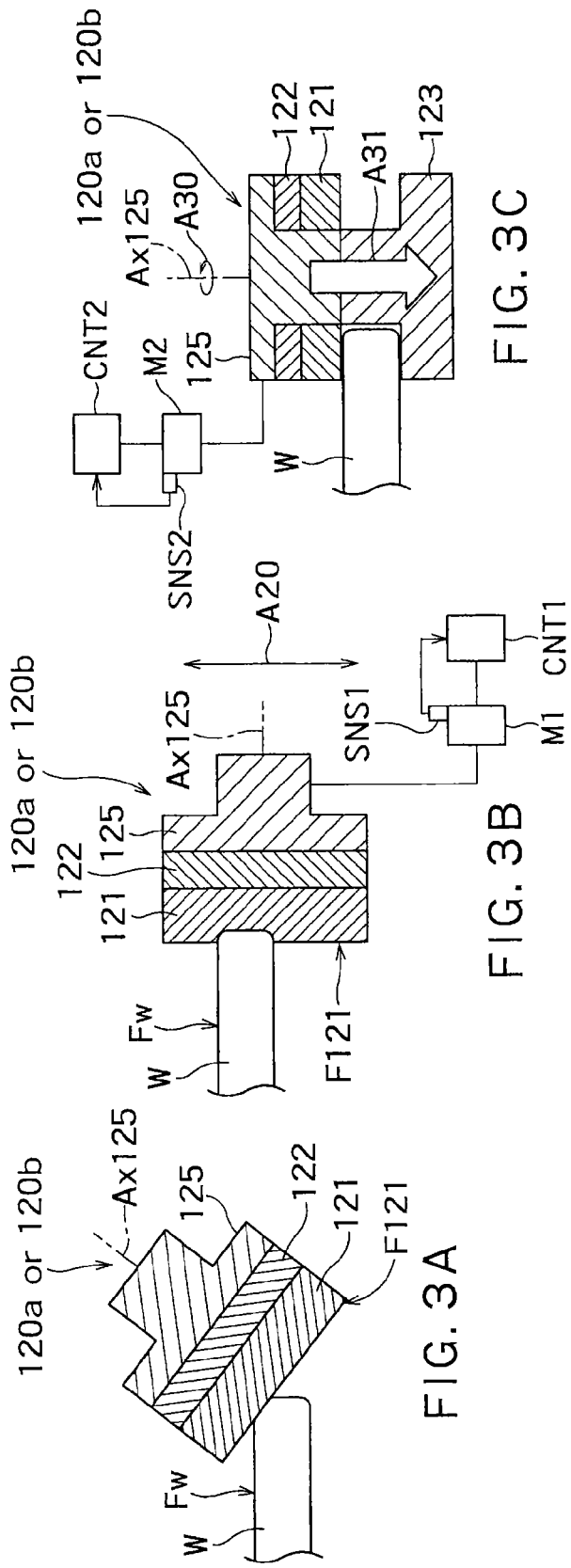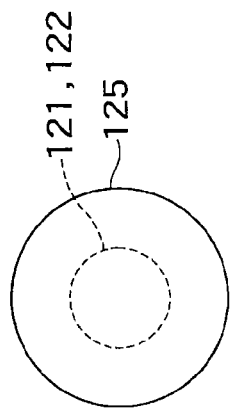

SEMICONDUCTOR MANUFACTURING APPARATUS AND MANUFACTURING METHOD OF SEMICONDUCTOR DEVICE

CROSS REFERENCE TO RELATED APPLICATIONS

This application is based upon and claims the benefit of priority from the prior U.S. Provisional Patent Application No. 62/106,268, filed on Jan. 22, 2015, the entire contents of which are incorporated herein by reference.

FIELD

The embodiments of the present invention relate to a semiconductor manufacturing apparatus and manufacturing method of semiconductor device.

BACKGROUND

A CMP (Chemical Mechanical Polishing) method is used to flatten a material layer on a semiconductor substrate. In the CMP method, the material layer on the semiconductor substrate is polished with an abrasive while slurry is supplied onto the abrasive.

However, if abrasive particles of the slurry remain on the semiconductor substrate after polishing the material layer by the CMP, deposits (such as a silicon dioxide film, a silicon nitride film, and amorphous silicon) are likely to adhere onto or around the abrasive particles at the subsequent steps. If the deposits peel off the semiconductor substrate at the following steps, the peeled deposits cause particles, which lead to a decrease in the yield.

Furthermore, generally, the abrasive particles of the slurry are positively charged. On the other hand, many of material layers such as silicon and a silicon dioxide film are negatively charged. The abrasive particles are thus likely to adhere to the material layer. The abrasive particles having adhered to the semiconductor substrate are conventionally removed by scrub cleaning with PVA (Polyvinyl Acetate) after the CMP. However, even after the scrub cleaning, the abrasive particles are likely to remain at end portions of the semiconductor substrate (exposed portions of the semiconductor substrate). Furthermore, when the semiconductor substrate is dried after the scrub cleaning, the abrasive particles remaining on the semiconductor substrate are firmly fixed to the semiconductor substrate and become harder to be removed. Therefore, even when the scrub cleaning is performed, the problem of the particles caused by the deposits still occurs.

BRIEF DESCRIPTION OF THE DRAWINGS

FIGS. 3A to 3C are cross-sectional views showing examples of a configuration of the end portion cleaners 120a and 120b according to the first embodiment, respectively;

FIG. 3D is a top view of the end portion cleaner 120a or 120b; and

DETAILED DESCRIPTION

Embodiments will now be explained with reference to the accompanying drawings. The present invention is not limited to the embodiments.

A semiconductor manufacturing apparatus according to an embodiment includes a first cleaner and a second cleaner. The first cleaner polishes a semiconductor substrate or a polishing target material on the semiconductor substrate with an abrasive and then cleans a top face of the semiconductor substrate or of the polishing target material while the semiconductor substrate is rotated. The second cleaner rubs an end portion of the semiconductor substrate with a physical contact according to rotation of the semiconductor substrate.

First Embodiment

Figure 1A:
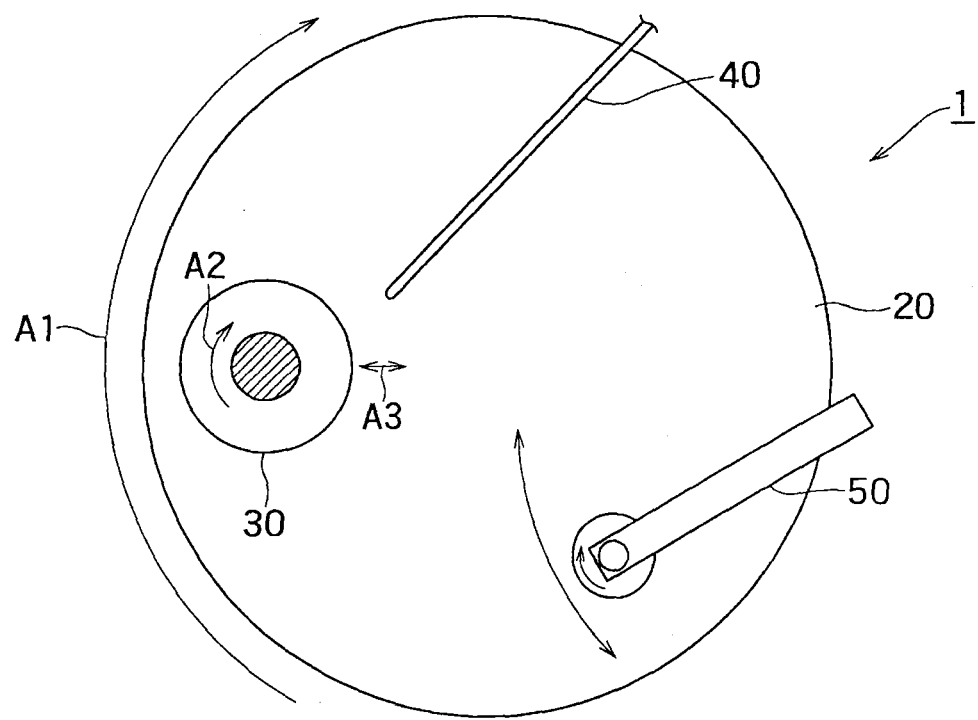
FIGS. 1A and 1B show a configuration example of a polisher 1 of a CMP apparatus according to a first embodiment.
Figure 1B:
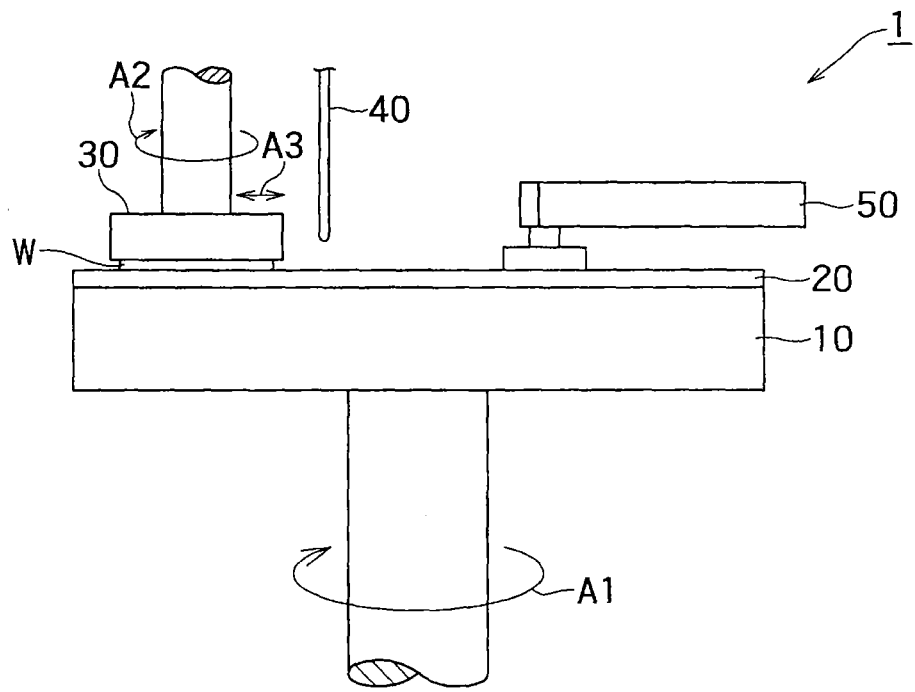

FIGS. 1A and 1B show a configuration example of a polisher 1 of a CMP apparatus according to a first embodiment. FIG. 1A is a top view of the polisher 1 and FIG. 1B is a side view of the polisher 1. The polisher 1 includes a platen 10, a polishing pad 20, a wafer carrier 30, a slurry supplier 40, and a pad conditioner 50.

The polishing pad 20 is provided on the platen 10. The polishing pad 20 can rotate (rotate around its own axis) together with the platen 10 on the center of the platen 10 as an axis as shown by an arrow A1. The polishing pad 20 polishes a semiconductor substrate W or a polishing target material on the semiconductor substrate W at a surface of the polishing pad 20. While the following explanations are given assuming that the polishing pad 20 polishes a polishing target material, the polishing target material can be the semiconductor substrate W itself. The wafer carrier 30 holds the semiconductor substrate W and presses the polishing target material against the polishing pad 20. The wafer carrier 30 can rotate on the center of the wafer carrier 30 as an axis as shown by an arrow A2. The wafer carrier 30 also can move to reciprocate between the center of the polishing pad 20 and an end portion thereof as shown by an arrow A3. Accordingly, the wafer carrier 30 can polish the polishing target material at an arbitrary position on the surface of the polishing pad 20. The slurry supplier 40 supplies slurry onto the polishing pad 20. The slurry contains an abrasive and enters between the polishing pad 20 and the polishing target material to polish the polishing target material. While the polishing pad 20 is rotating in a direction of the arrow A1, the wafer carrier 30 rotates the semiconductor substrate W in a direction of the arrow A2 and also moves the semiconductor substrate W in a direction of the arrow A3. The polishing target material of the semiconductor substrate W is thus polished. The pad conditioner 50 recovers a surface condition of the polishing pad 20 to enable the polishing target material to be polished at as uniform a rate as possible.

Figure 2A:
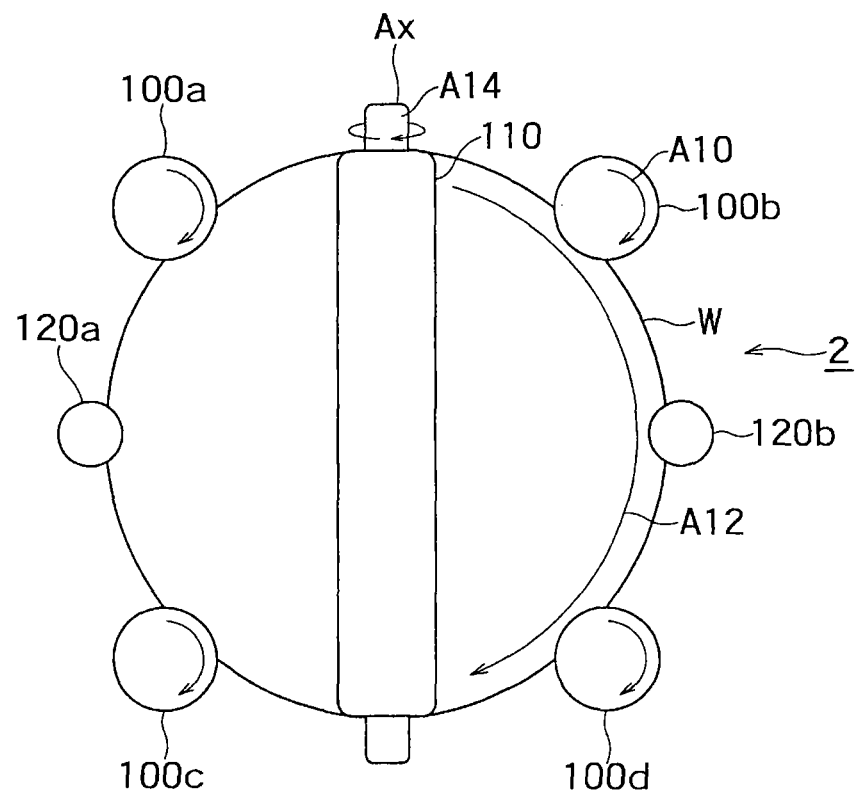
FIGS. 2A and 2B show a configuration example of a washer 2 in the CMP apparatus according to the first embodiment.
Figure 2B:
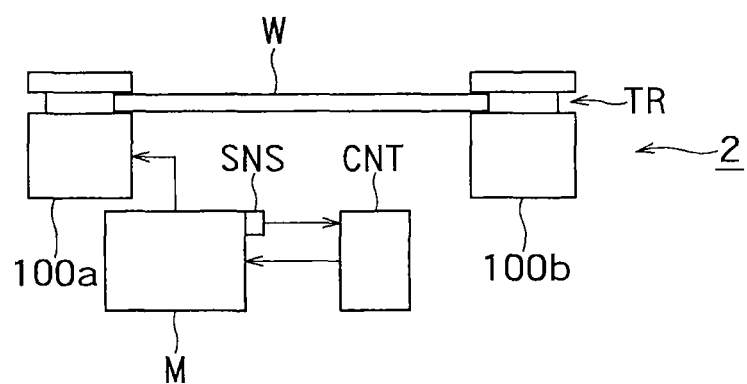

FIGS. 2A and 2B show a configuration example of a washer 2 in the CMP apparatus according to the first embodiment. FIG. 2A is a top view of the washer 2 and FIG. 2B is a side view of the washer 2. The washer 2 according to the first embodiment can be incorporated in the CMP apparatus together with the polisher 1 shown in FIGS. 1A and 1B or the washer 2 can be provided outside the CMP apparatus separately from the washer 1.

The washer 2 includes substrate rotating parts 100a to 100d, a scrub cleaner 110, and end portion cleaners 120a and 120b.

The substrate rotating parts 100a to 100d operate to nip end portions of the semiconductor substrate W to rotate the semiconductor substrate W in a direction of an arrow A12. More specifically, the substrate rotating parts 100a to 100d have trenches TR, respectively, as shown in FIG. 2B and the trenches TR of the substrate rotating parts 100a to 100d receive the end portions of the semiconductor substrate W, respectively. The substrate rotating parts 100a to 100d thus hold the semiconductor substrate W. The substrate rotating parts 100a to 100d rotate on the centers thereof as axes, respectively, as shown by an arrow A10 in a state of holding the semiconductor substrate W. The substrate rotating parts 100a to 100d rotate around their own axes, respectively, and forward the semiconductor substrate W in the direction of the arrow A12 to rotate the semiconductor substrate W on the center of the semiconductor substrate W as an axis. The substrate rotating parts 100a to 100d are formed of an elastic material not to damage the semiconductor substrate W and, for example, are formed of a urethane resin (polyurethane or urethane rubber).

The scrub cleaner 110 serving as a first cleaner is formed of an elastic material such as PVA and can rotate on an axis Ax as shown by an arrow A14 in FIG. 2A in a state of being in contact with the surface of the polishing target material on the semiconductor substrate W.

After the polishing target material is polished with the polisher 1, the scrub cleaner 110 cleans the top face of the polishing target material while rotating in a direction of the arrow A14. At that time, the semiconductor substrate W rotates in the direction of the arrow A12. This removes the abrasive contained in the slurry from the surface of the polishing target material.

However, with the scrub cleaner 110, the abrasive particles are likely to remain on exposed portions of the semiconductor substrate W at end portions of the semiconductor substrate W (an outer peripheral area having a width of about 2 millimeters from the outer edge of the semiconductor substrate W, for example) as described above.

To address this problem, the end portion cleaners 120a and 120b serving as a second cleaner are provided in the first embodiment. The end portion cleaners 120a and 120b physically are in contact with the end portions of the semiconductor substrate W according to the rotation of the semiconductor substrate W and rub the end portions. This enables the abrasive particles remaining on the end portions of the semiconductor substrate W to be removed more reliably. The end portion cleaners 120a and 120b can be fixed to the cleaner 2 and rub the end portions of the semiconductor substrate W with the rotation of the semiconductor substrate W. Alternatively, the end portion cleaners 120a and 120b can rub the end portions of the semiconductor substrate W while rotating on the centers of the end portion cleaners 120a and 120b as axes, respectively. A more specific configuration of the end portion cleaners 120a and 120b is explained later with reference to FIGS. 3A to 3D.

As shown in FIG. 2B, the cleaner 2 further includes a motor M, a current sensor SNS, and a controller CNT. The motor M drives the substrate rotating parts 100a to 100d, thereby rotating the semiconductor substrate W. The current sensor SNS serving as a current measuring part measures a value of the current supplied to the motor M. The controller CNT serving as an operating part receives the current value measured by the current sensor SNS and adjusts the current to be supplied to the motor M. The controller CNT also detects termination of lives of the end portion cleaners 120a and 120b upon reception of the current value measured by the current sensor SNS. Detection of termination of the lives of the end portion cleaners 120a and 120b is also explained later.

FIGS. 3A to 3C are cross-sectional views showing examples of a configuration of the end portion cleaners 120a and 120b according to the first embodiment, respectively. The end portion cleaners 120a and 120b respectively have a stacked structure including a first portion 121 and a second portion 122.

The first portion 121 is in contact with an end portion of the semiconductor substrate W and removes the abrasive having adhered to the end portion of the semiconductor substrate W. The first portion 121 includes a foamed resin. For example, the foamed resin is a resin foamed like a mesh in micron unit and can be a melamine resin. As the melamine resin, a melamine-formaldehyde resin is preferable, for example. The melamine resin is excellent in the heat resistance, the water resistance, and the like and also is easily available and low in the cost because it is industrially manufactured in large volume. Chemical binding of such a resin is weaker than that of the semiconductor substrate W or the polishing target material. Therefore, chemical binding of the first portion 121 is broken by a physical contact with the semiconductor substrate W or the polishing target material and the first portion 121 is scraped together with the abrasive particles (with the abrasive particles adhering thereto). For example, the melamine-formaldehyde resin is foamed like a mesh in micron unit and is scraped while taking the abrasive particles in the mesh. Accordingly, the first portion 121 can remove the abrasive particles having adhered to the end portion of the semiconductor substrate W without using a cleaning agent. Furthermore, because the first portion 121 is scraped while taking the abrasive particles therein, the first portion 121 can rub the end portion of the semiconductor substrate W at an unused portion thereof without being clogged with the abrasive particles.

The second portion 122 supports the first portion 121 and contains an elastic material softer than the semiconductor substrate W and the polishing target material. The second portion 122 is formed of a material different from that of the first portion 121 and is formed of an elastic material such as a polyurethane resin or a nonwoven fabric. Because the second portion 122 is an elastic material, damages on the semiconductor substrate W and the polishing target material can be suppressed even when the first portion 121 is scraped and the second portion 122 is exposed.

A base 125 supports the second portion 122. A resin or the like harder than the first and second portions 121 and 122 is used for the base 125. Accordingly, the base 125 can reliably support the first and second portions 121 and 122.

In the end portion cleaner 120a or 120b shown in FIG. 3A, the base 125 is fixed to the cleaner 2 in such a manner that a central axis Ax125 of the base 125 is inclined with respect to the surface of the semiconductor substrate W. Therefore, a contact face F121 with the semiconductor substrate W in the first portion 121 is in contact with a surface Fw of the semiconductor substrate W to be inclined with respect to the surface Fw. When the semiconductor substrate W is rotated in this state, the first portion 121 rubs the end portion of the semiconductor substrate W and removes the abrasive particles having adhered to the end portion of the semiconductor substrate W.

In the end portion cleaner 120a or 120b shown in FIG. 3B, the base 125 is arranged in such a manner that the central axis Ax125 is substantially parallel to the surface Fw of the semiconductor substrate W. Therefore, the contact face F121 with the semiconductor substrate W in the first portion 121 is in contact with the surface Fw of the semiconductor substrate W to be substantially perpendicular to the surface Fw. At that time, because the first portion 121 is formed of an elastic material, when the end portion of the semiconductor substrate W is pressed against the first portion 121, the end portion of the semiconductor substrate W is slightly buried in the first portion 121 and side surfaces and the end portion of the semiconductor substrate W are covered by the first portion 121. When the semiconductor substrate W is rotated in this state, the first portion 121 rubs the end portion of the semiconductor substrate W and removes the abrasive particles having adhered to the end portion of the semiconductor substrate W.

The end portion cleaner 120a or 120b shown in FIG. 3B further includes a motor M1 and a controller CMT1. The controller CNT1 controls the motor M1 and the motor M1 moves the end portion cleaner 120a or 120b in a direction (an arrow A20) substantially perpendicular to the surface Fw of the semiconductor substrate W. Accordingly, the end portion cleaner 120a or 120b can move a contact position in the first portion 121 between the contact face F121 and the semiconductor substrate W.

When the position of the end portion cleaner 120a or 120b is fixed, the first portion 121 is scraped only at a specific position where the semiconductor substrate W is in contact therewith. In this case, the second portion 122 is exposed in a short time and the life of the end portion cleaner 120a or 120b is shortened.

On the other hand, when the end portion cleaner 120a or 120b moves in a direction of the arrow A20 (vertically), the contact position between the contact face F121 and the semiconductor substrate W moves and thus the life of the end portion cleaner 120a or 120b can be elongated.

The end portion cleaner 120a or 120b shown in FIG. 3C further includes a third portion 123 facing the first portion 121. The first portion 121 and the third portion 123 sandwich the end portion of the semiconductor substrate W therebetween. For example, the first portion 121 moves in a direction of an arrow A31 and elastically presses the end portion of the semiconductor substrate W against the third portion 123. It suffices that the first portion 121 elastically presses the end portion of the semiconductor substrate W using a motor (not shown) or an elastic body (a spring or a rubber, for example).

The end portion cleaner 120a or 120b shown in FIG. 3C further includes a motor M2 and a controller CNT2. The controller CNT2 controls the motor M2 and the motor M2 rotates the end portion cleaner 120a or 120b on the central axis Ax125 thereof as an axis as shown by an arrow A30.

Accordingly, the end portion cleaner 120a or 120b rotates in a state of sandwiching the end portion of the semiconductor substrate W between the first portion 121 and the third portion 123. The semiconductor substrate W rotates in the direction of the arrow A12 shown in FIG. 2A. Accordingly, the first portion 121 can rub the end portion of the semiconductor substrate W and remove the abrasive particles having adhered to the end portion of the semiconductor substrate W.

FIG. 3D is a top view of the end portion cleaner 120a or 120b. The end portion cleaner 120a or 120b can be circular in the top view as shown in FIG. 3D. The end portion cleaner 120a or 120b can have any of the configurations shown in FIGS. 3A to 3C.

(Life Detection)

Because the first portion 121 is scraped due to friction with the semiconductor substrate W, the end portion cleaner 120a or 120b has a certain lifetime. For example, when the first portion 121 is scraped and the second portion 122 is exposed, the end portion cleaner 120a or 120b needs to be replaced. Detection of such life termination of the end portion cleaner 120a or 120b can be achieved by the current sensor SNS and the controller CNT shown in FIG. 2B.

More specifically, it is assumed that a frictional force between the second portion 122 and the semiconductor substrate W is larger than that between the first portion 121 and the semiconductor substrate W. In this case, when the first portion 121 is scraped and the second portion 122 is exposed, the controller CNT in FIG. 2B needs to supply a relatively large current to the motor M to keep the rotation rate of the semiconductor substrate W. In this case, the current sensor SNS is supposed to detect a larger current value after a point of time when the second portion 122 is in contact with the semiconductor substrate W than before the second portion 122 is in contact with the semiconductor substrate W. Therefore, the controller CNT can determine that the second portion 122 is exposed based on a change ratio (an inclination) of the current supplied to the motor M1. That is, the controller CNT can detect termination of the life of the end portion cleaner 120a or 120b.

Alternatively, the termination of the life of the end portion cleaner 120a or 120b can be detected using the motor M1, the controller CNT1, and the current sensor SNS1 shown in FIG. 3B.

For example, when the second portion 122 is exposed, the frictional force between the semiconductor substrate W and the end portion cleaner 120a or 120b is similarly increased. Therefore, the controller CNT1 shown in FIG. 3B supplies a relatively large current to the motor M1 to move the end portion cleaner 120a or 120b in the direction of the arrow A20. The current sensor SNS1 is thus supposed to detect a larger current after a point of time when the second portion 122 is exposed than before the second portion 122 is exposed. Therefore, the controller CNT1 can determine that the second portion 122 is exposed based on the current measurement value of the current sensor SNS1. That is, the controller CNT1 can detect the termination of the life of the end portion cleaner 120a or 120b.

Further alternatively, the termination of the life of the end portion cleaner 120a or 120b can be detected using the motor M2, the controller CNT2, and the current sensor SNS2 shown in FIG. 3C.

For example, when the second portion 122 is exposed, the controller CNT2 shown in FIG. 3C supplies a relatively large current to the motor M2 to rotate the end portion cleaner 120a or 120b in a direction of the arrow A30. The current sensor SNS2 is thus supposed to detect a larger current after a point of time when the second portion 122 is exposed than before the second portion 122 is exposed. Therefore, the controller CNT2 can determine that the second portion 122 is exposed based on the current measurement value of the current sensor SNS2. That is, the controller CNT2 can detect the termination of the life of the end portion cleaner 120a or 120b.

It suffices that the controller CNT, CNT1, or CNT2 outputs an alarm upon detection of the life termination of the end portion cleaner 120a or 120b. It suffices that the alarm is output by display on a monitor (not shown) or by issuance of a warning sound from a speaker (not shown).

The current sensors SNS, SNS1, and SNS2 can be torque sensors. In this case, the controllers CNT, CNT1, and CNT2 determine whether the second portion 122 is exposed based on torque measurement values from the torque sensors, respectively.

As described above, in the CMP apparatus according to the first embodiment, along with the scrub cleaner 110, the end portion cleaners 120a and 120b rub the end portions of the semiconductor substrate W with physical contacts according to the rotation of the semiconductor substrate W. This enables the abrasive particles remaining on the end portions of the semiconductor substrate W to be removed more reliably. Because few abrasive particles of the slurry remain on the semiconductor substrate W, it is possible to suppress deposits from adhering onto or around the abrasive particles at the subsequent steps. As a result, occurrence of particles due to the deposits can be suppressed.

Furthermore, the first portions 121 of the end portion cleaners 120a and 120b are foamed like a mesh in micron unit and are scraped while taking the abrasive particles in the mesh. Accordingly, the first portions 121 of the end portion cleaners 120a and 120b can remove the abrasive particles having adhered to the end portions of the semiconductor substrate W without using a cleaning agent. Furthermore, the first portions 121 can rub the end portions of the semiconductor substrate W at unused portions without being clogged with the abrasive particles.

The end portion cleaners 120a and 120b respectively have the stacked structure including the first portion 121 and the second portion 122. Because the second portion 122 is formed of an elastic material, damages of the semiconductor substrate W and the polishing target material can be suppressed even when the second portion 122 is exposed. Furthermore, because the frictional force between the second portion 122 and the semiconductor substrate W is different from that between the first portion 121 and the semiconductor substrate W, the controller CNT, CNT1, or CNT2 can detect the termination of the lives of the end portion cleaners 120a and 120b by monitoring a current consumption of the motor M, M1, or M2.

A manufacturing method of a semiconductor device according to the first embodiment is explained next.

Figure 4:
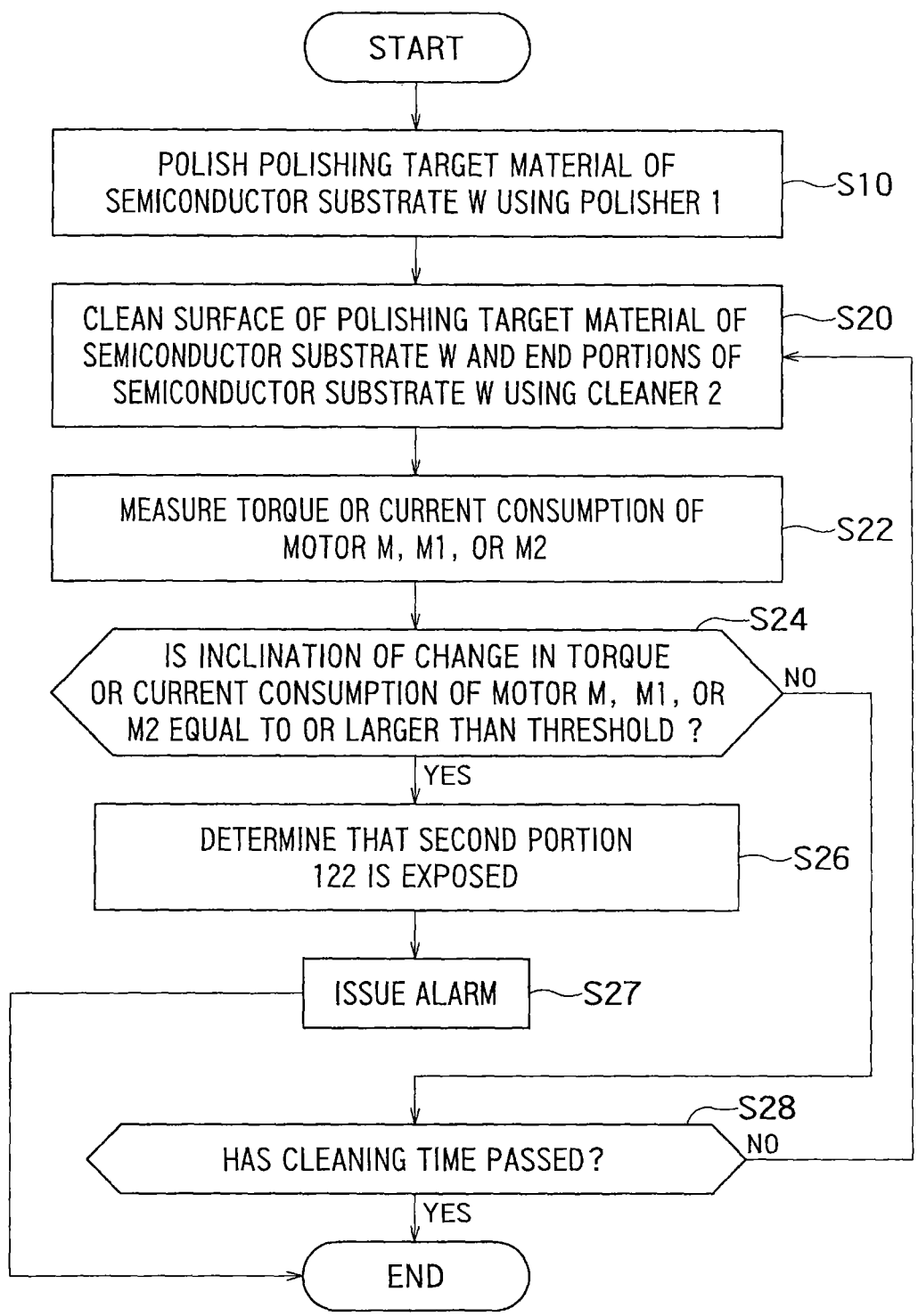
FIG. 4 is a flowchart showing an example of a manufacturing method of a semiconductor device using the CMP apparatus according to the first embodiment.

FIG. 4 is a flowchart showing an example of a manufacturing method of a semiconductor device using the CMP apparatus according to the first embodiment.

First, the polishing target material of the semiconductor substrate W is polished by the CMP method using the polisher 1 shown in FIGS. 1A and 1B (Step S10).

Next, the surface of the polishing target material of the semiconductor substrate W and the end portions of the semiconductor substrate W are cleaned using the cleaner 2 shown in FIGS. 2A and 2B (Step S20). At that time, the scrub cleaner 110 cleans the top face of the polishing target material while the semiconductor substrate W is rotated. At the same time, the end portion cleaners 120a and 120b rub the end portions of the semiconductor substrate W with physical contacts according to the rotation of the semiconductor substrate W. The end portion cleaners 120a and 120b can be any one of those shown in FIGS. 3A to 3C.

During cleaning of the semiconductor substrate W, the current sensor SNS, SNS1, or SNS2 measures the torque or the current consumption of the motor M, M1, or M2 that rotates the semiconductor substrate W (Step S22).

When the torque or the current consumption of the motor M, M1, or M2 does not greatly change and the change ratio (the inclination) of the torque or the current consumption is smaller than a predetermined threshold (NO at Step S24) during cleaning of the semiconductor substrate W, the controller CNT, CNT1, or CNT2 determines that the first portion 121 remains and that the second portion 122 is not exposed and then the cleaning at Step S20 is continued. It suffices that the predetermined threshold is previously stored in a memory in the controller CNT, CNT1, or CNT2 or a memory outside the controller CNT, CNT1, or CNT2 (these memories are not shown).

On the other hand, when the torque or the current consumption of the motor M, M1, or M2 sharply increases and the change ratio (the inclination) of the torque or the current consumption becomes equal to or larger than the predetermined threshold (YES at Step S24), the controller CNT, CNT1, or CNT2 determines that the second portion 122 is exposed (Step S26). In this case, the controller CNT, CNT1, or CNT2 displays or issues an alarm to notify an operator of that effect (Step S27). The cleaner 2 can stop the cleaning process in this case. The operator can know the termination of the lives of the end portion cleaners 120a and 120b and can replace the end portion cleaners 120a and 120b at an appropriate moment.

The processes at Steps S20 to S27 are continued until a predetermined cleaning time has passed (NO at Step S28). When the predetermined time has passed (YES at Step S28), the cleaning process ends.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a first cleaner cleaning a top face of a semiconductor substrate or of a polishing target material while the semiconductor substrate is rotated, after polishing the semiconductor substrate or the polishing target material on the semiconductor substrate with an abrasive; and
a second cleaner rubbing an end portion of the semiconductor substrate with a physical contact according to rotation of the semiconductor substrate, wherein
the second cleaner comprises a first portion configured to be in contact with the semiconductor substrate and a third portion facing the first portion,
the first portion comprises a foamed resin, and
the first portion and the third portion rub an end portion of the semiconductor substrate in a state of sandwiching the end portion therebetween.

2. The apparatus of claim 1, wherein the first portion comprises a resin foamed as a micronic mesh structure.

3. The apparatus of claim 2, wherein chemical binding of the resin of the first portion is weaker than that of the semiconductor substrate or the polishing target material.

4. The apparatus of claim 3, wherein the first portion comprises a melamine resin.

5. The apparatus of claim 4, wherein the first portion comprises a melamine-formaldehyde resin.

6. The apparatus of claim 1, wherein
the second cleaner further comprises a second portion supporting the first portion, and
the second portion comprises an elastic material softer than the semiconductor substrate and the polishing target material.

7. The apparatus of claim 6, wherein the second portion comprises a polyurethane resin or a nonwoven fabric.

8. The apparatus of claim 1, wherein the second cleaner is capable of rotating on a center of the second cleaner as an axis.

9. The apparatus of claim 1, wherein the second cleaner is capable of rotating on a center of the second cleaner as an axis.

10. A semiconductor manufacturing apparatus comprising:
a first cleaner cleaning a top face of a semiconductor substrate or of a polishing target material while the semiconductor substrate is rotated, after polishing the semiconductor substrate or the polishing target material on the semiconductor substrate with an abrasive;
a second cleaner rubbing an end portion of the semiconductor substrate with a physical contact according to rotation of the semiconductor substrate, the second cleaner comprising a first portion being in contact with the semiconductor substrate and a second portion supporting the first portion, the first portion comprising a foamed resin, and the second portion comprising an elastic material softer than the semiconductor substrate and the polishing target material,
a first motor rotating the semiconductor substrate;
a first measuring part measuring a torque or a current consumption of the first motor; and
a first operating part determining whether the second portion is exposed based on a measurement value of the torque or the current consumption of the first motor.

11. The apparatus of claim 10, further comprising:
a second motor rotating the second cleaner;
a second measuring part measuring a torque or a current consumption of the second motor; and
a second operating part determining whether the second portion is exposed based on a measurement value of the torque or the current consumption of the second motor.

12. The apparatus of claim 10, wherein the second cleaner is arranged in such a manner that a contact face with the semiconductor substrate in the first portion is inclined with respect to a surface of the semiconductor substrate.

13. The apparatus of claim 10, wherein the second cleaner is arranged in such a manner that a contact face with the semiconductor substrate in the first portion is substantially perpendicular to a surface of the semiconductor substrate.

14. The apparatus of claim 13, wherein the second cleaner can move in a direction substantially perpendicular to the surface of the semiconductor substrate in order to move a contact position in the first portion between the contact face and the semiconductor substrate.

15. A manufacturing method of a semiconductor device using a semiconductor manufacturing apparatus comprising a first cleaner cleaning a top face of a semiconductor substrate or of a polishing target material on the semiconductor substrate, a second cleaner cleaning an end portion of the semiconductor substrate, a motor rotating the semiconductor substrate, a measuring part measuring a torque or a current consumption of the motor, and an operating part connected to the measuring part, the second cleaner comprising a first portion being in contact with the semiconductor substrate and a second portion supporting the first portion,
the method comprising:
polishing the polishing target material with an abrasive; and
cleaning the top face of the semiconductor substrate or of the polishing target material with the first cleaner while the semiconductor substrate is rotated, and rubbing the end portion of the semiconductor substrate with a physical contact of the second cleaner according to rotation of the semiconductor substrate;
measuring the torque or the current consumption of the motor rotating the semiconductor substrate; and
determining whether the second portion is exposed based on a measurement value of the torque or the current consumption of the motor.

16. The method of claim 15, wherein the second cleaner rotates on a center of the second cleaner as an axis.

17. The method of claim 15, wherein a first portion of the second cleaner being in contact with the semiconductor substrate is a melamine resin.

* * * * *